United States Patent
Peng et al.

(10) Patent No.: US 12,114,534 B2
(45) Date of Patent: Oct. 8, 2024

(54) OLED DISPLAY SUBSTRATE, MANUFACTURING METHOD THEREOF, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Liman Peng, Beijing (CN); Qi Liu, Beijing (CN); Liangliang Liu, Beijing (CN); Jianqiang Wang, Beijing (CN); Yan Wu, Beijing (CN); Jin Yang, Beijing (CN)

(73) Assignees: ORDOS YUANSHENG OPTOELECTRONICS CO., LTD ., Ordos (CN); BOE TECHNOLOGY GROUP CO., LTD, Beijing (CN)

( * ) Notice: Subject to any disclaimer, the term of this patent is extended or adjusted under 35 U.S.C. 154(b) by 810 days.

(21) Appl. No.: 17/041,162

(22) PCT Filed: Apr. 29, 2020

(86) PCT No.: PCT/CN2020/087796
§ 371 (c)(1),
(2) Date: Sep. 24, 2020

(87) PCT Pub. No.: WO2020/253396
PCT Pub. Date: Dec. 24, 2020

(65) Prior Publication Data
US 2023/0098150 A1 Mar. 30, 2023

(30) Foreign Application Priority Data

Jun. 21, 2019 (CN) .......................... 201910544755.0

(51) Int. Cl.
*H10K 59/122* (2023.01)
*H10K 71/00* (2023.01)
(Continued)

(52) U.S. Cl.
CPC ........... *H10K 59/122* (2023.02); *H10K 71/00* (2023.02); *H10K 50/11* (2023.02);
(Continued)

(58) Field of Classification Search
CPC .. H10K 59/122; H10K 59/1201; H10K 59/35; H10K 50/11; H10K 71/00; H10K 71/166
(Continued)

(56) References Cited

U.S. PATENT DOCUMENTS

2010/0244668 A1 9/2010 Nakamura et al.
2016/0066409 A1* 3/2016 Kwon ................. H01L 27/1218
174/254
(Continued)

FOREIGN PATENT DOCUMENTS

CN 106816554 A 6/2017
CN 108695361 A 10/2018
(Continued)

OTHER PUBLICATIONS

Machine English Translation of CN109713023 (Year: 2019).*
(Continued)

*Primary Examiner* — Dzung Tran
(74) *Attorney, Agent, or Firm* — Brooks Kushman P.C.

(57) ABSTRACT

The disclosure provides an OLED display substrate, a manufacturing method thereof, and a display device, wherein the OLED display substrate is provided with a display area and an edge area surrounding the display area, the OLED display substrate includes a back plate and a pixel-defining layer on
(Continued)

the back plate, and a protrusion is provided on the back plate at the edge area of the OLED display substrate.

4 Claims, 3 Drawing Sheets

(51) Int. Cl.
  *H10K 50/11* (2023.01)
  *H10K 59/12* (2023.01)
  *H10K 59/35* (2023.01)
  *H10K 71/16* (2023.01)
(52) U.S. Cl.
  CPC ......... *H10K 59/1201* (2023.02); *H10K 59/35* (2023.02); *H10K 71/166* (2023.02)
(58) Field of Classification Search
  USPC ......................................................... 257/40
  See application file for complete search history.

(56) References Cited

U.S. PATENT DOCUMENTS

| | | | |
|---|---|---|---|
| 2016/0260928 A1* | 9/2016 | Choi | H10K 50/844 |
| 2016/0322599 A1 | 11/2016 | Ho et al. | |
| 2017/0278912 A1* | 9/2017 | Kim | H10K 59/122 |
| 2018/0061910 A1* | 3/2018 | Cai | H10K 59/122 |
| 2018/0287064 A1 | 10/2018 | Matsueda et al. | |
| 2019/0148473 A1* | 5/2019 | Yamazaki | H10K 50/171 |
| | | | 313/504 |
| 2020/0052050 A1 | 2/2020 | Jiang et al. | |
| 2020/0239997 A1 | 7/2020 | Yuan et al. | |
| 2020/0251682 A1 | 8/2020 | Guo et al. | |

FOREIGN PATENT DOCUMENTS

| | | |
|---|---|---|
| CN | 108766983 A | 10/2018 |
| CN | 109148522 A | 1/2019 |
| CN | 109713023 A | 5/2019 |
| CN | 109755418 A | 5/2019 |
| CN | 109860422 A | 6/2019 |
| CN | 110137238 A | 8/2019 |

OTHER PUBLICATIONS

First Office Action for Chinese Application No. 201910544755.0, dated Oct. 26, 2020, 8 Pages.
Second Office Action for Chinese Application No. 201910544755.0, dated Jan. 14, 2021, 7 Pages.
International Search Report and Written Opinion for Application No. PCT/CN2020/087796, dated Jul. 30, 2020, 9 Pages.

* cited by examiner

OLED DISPLAY SUBSTRATE, MANUFACTURING METHOD THEREOF, AND DISPLAY DEVICE

CROSS-REFERENCE TO RELATED APPLICATIONS

This application is the U.S. national phase of PCT Application No. PCT/CN2020/087796 filed on Apr. 29, 2020, which claims priority to Chinese Patent Application No. 201910544755.0, filed on Jun. 21, 2019, which are incorporated herein by reference in their entireties.

TECHNICAL FIELD

The disclosure relates to the technical field of display, in particular to an OLED display substrate, a manufacturing method thereof, and a display device.

BACKGROUND

An OLED display device is an active light-emitting device without a backlight source, manufacturing an OLED display substrate requires an organic light-emitting material evaporated onto the substrate, and after the OLED display substrate is manufactured, current inputs to an anode and a cathode of the OLED display substrate are all that is needed to enable the organic light-emitting material to emit light.

In the evaporation process, the organic light-emitting material is evaporated onto the substrate by using a fine metal mask (FMM) which may come into excessive contact with an edge area of the OLED display substrate according to the manufacturing process of the OLED display substrate in some related art, leading to electrostatic discharge; and in the evaporation process, the OLED display substrate and the fine metal mask may move relatively, and the resulted friction further increases the possibility of electrostatic discharge. Electrostatic discharge can damage the fine metal mask, as a result, an abnormality occurs in the evaporation, and the yield of the OLED display substrate products is adversely influenced.

SUMMARY

The embodiments of the disclosure provide the following technical solution:

In one aspect, an OLED display substrate is provided, the OLED display substrate having a display area and an edge area surrounding the display area, the OLED display substrate comprising a back plate and a pixel-defining layer on the back plate, wherein at the edge area of the OLED display substrate, protrusions are provided on the back plate.

Optionally, at the edge area of the OLED display substrate, the protrusions are columnar structures formed in the pixel-defining layer.

Optionally, at least part of the protrusions is made of the same material as the pixel-defining layer of the OLED display substrate.

Optionally, at the display area of the OLED display substrate, a spacer is further provided on the pixel-defining layer, and the protrusion at the edge area and the spacer are formed by the same process and made of the same material.

Optionally, a height difference between an end face of the spacer away from the back plate and an end face of the protrusion away from the back plate is not greater than a preset threshold value.

Optionally, the height difference between an end face of the spacer away from the back plate and an end face of the protrusion away from the back plate is not greater than 3 µm.

Optionally, an end face of the spacer 4 away from the back plate and an end face of the protrusion 6 away from the back plate are located on the same horizontal plane.

Optionally, a planarization layer is provided between the back plate and the pixel-defining layer.

The embodiments of the disclosure further provide a display device comprising the OLED display substrate mentioned above.

The embodiments of the invention further provide a manufacturing method of the OLED display substrate comprising the display area and the edge area surrounding the display area, the manufacturing method comprising the steps of:
  forming the planarization layer on the back plate; and
  forming the protrusion at the edge area.

Optionally, the step of forming the protrusion at the edge area comprises:
  forming the pixel-defining layer of the OLED display substrate and the protrusion on the planarization layer through a single patterning process, wherein the pixel-defining layer and the protrusion are made of the same material.

Optionally, after forming the planarization layer on the back plate, the manufacturing method further comprises the steps of:
  forming the pixel-defining layer on the planarization layer; and
  forming the spacer at the display area of the OLED display substrate and the protrusion at the edge area through a single patterning process, wherein the spacer and the protrusion are made of the same material.

Optionally, after forming the planarization layer on the back plate, the manufacturing method further comprises the steps of:
  forming the pixel-defining layer at the display area and a first part of the protrusions at the edge area through a single patterning process;
  forming the spacer at the display area and a second part of the protrusions at the edge area through a single patterning process, and the first part and the second part composing the protrusion.

Optionally, the manufacturing method further comprises:
  evaporating the organic light-emitting material onto pixel areas defined by the pixel-defining layer.

DETAILED DESCRIPTION

In order that the technical problems to be solved by the embodiments, technical solutions, and advantages of the disclosure will become more apparent, a detailed description will be given below with reference to the accompanying drawings and specific examples.

An OLED display device is an active light-emitting device without a backlight source, manufacturing an OLED display substrate requires an organic light-emitting material evaporated onto the substrate, and after the OLED display substrate is manufactured, current inputs to an anode and a cathode of the OLED display substrate may enable the organic light-emitting material to emit light.

Figure 1:
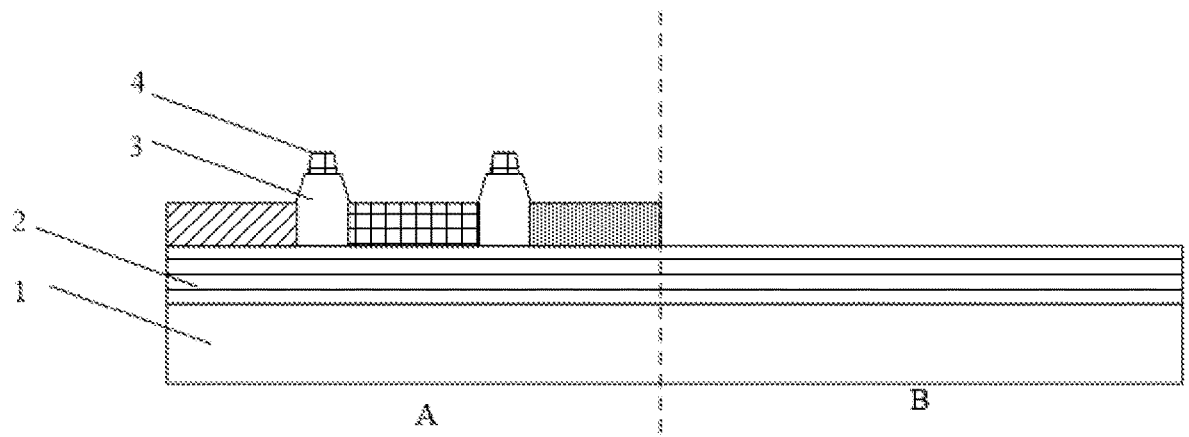
FIG. 1 is a schematic view showing a structure of an OLED display substrate in the related art.
Figure 2:
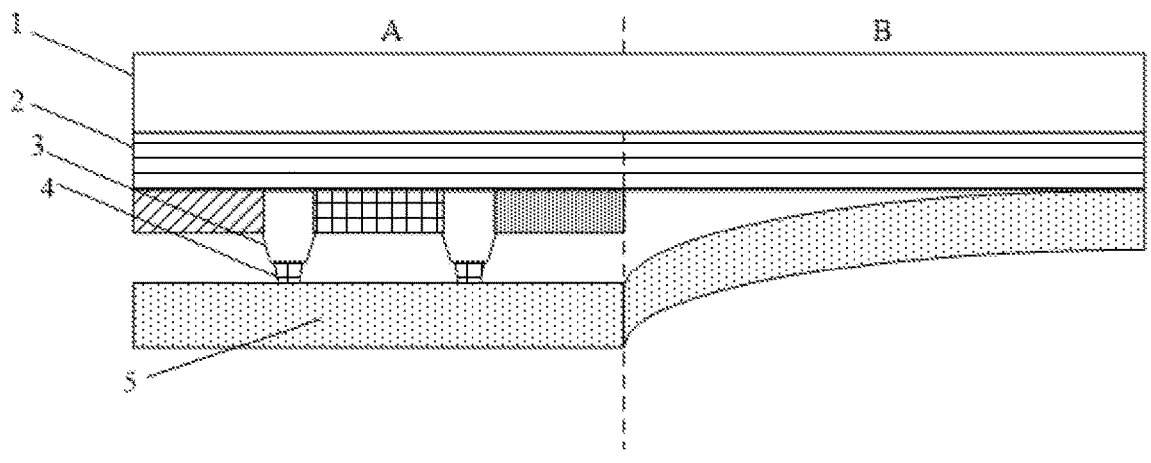
FIG. 2 is a schematic diagram illustrating evaporation with a fine metal mask in the manufacturing process of the OLED display substrate in the related art.

In the evaporation process, the organic light-emitting material is evaporated onto the substrate by using a fine metal mask (FMM) so that different organic light-emitting materials are evaporated onto different pixels by the fine metal mask, and as shown in FIG. 1, a thin film transistor array layer 2, a pixel-defining layer 3 and a spacer 4 are formed in a display area A of the OLED display substrate, wherein organic light-emitting materials of different colors are evaporated onto pixel areas defined by the pixel-defining layer 3. As shown in FIG. 2, when the evaporation is carried out, the spacer 4 can prevent the display area A from coming into excessive contact with the fine metal mask 5, the fine metal mask 5 is made of metal, and in the case of excessive contact of the fine metal mask 5 with the OLED display substrate, electrostatic discharge (ESD) is likely to occur at the contact position, causing damages to the fine metal mask 5 and abnormalities in the evaporation, for example, if materials of red, green, and blue colors are evaporated onto incorrect places, a poor color mixture will be caused.

As shown in FIGS. 1 and 2, an edge area B of the OLED display substrate in the related art is not provided with the spacer, therefore, the fine metal mask 5 may come into excessive contact with the edge area B of the OLED display substrate during evaporation, leading to electrostatic discharge; and in the evaporation process, the OLED display substrate and the fine metal mask 5 may move relatively, and the resulted friction increases the possibility of electrostatic discharge. Electrostatic discharge can damage the fine metal mask 5, as a result, an abnormality occurs in the evaporation, and the yield of the OLED display substrate products is adversely influenced. In addition, damages to the fine metal mask 5 may also cause increased production costs.

An object of the embodiments of the disclosure is to solve the above problems by providing an OLED display substrate, a manufacturing method thereof, and a display device, which can avoid electrostatic discharge in the evaporation process, improve the yield of the OLED display substrate products, prolong the service life of the fine metal mask, and reduce the production costs.

Figure 3:
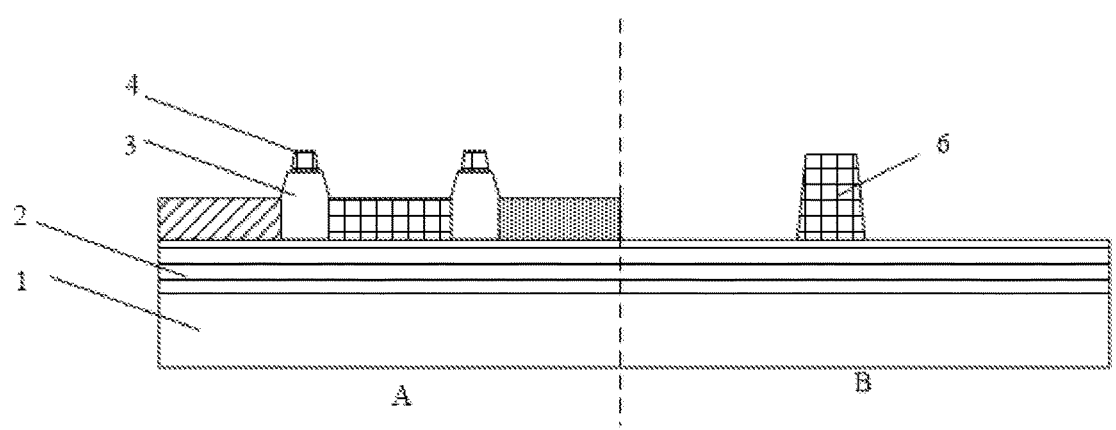
FIG. 3 is a schematic diagram showing the structure of the OLED display substrate according to an embodiment of the disclosure.

An embodiment of the disclosure provides an OLED display substrate, as shown in FIG. 3, including the display area A and the edge area B surrounding the display area, the edge area B of the OLED display substrate being provided with a protrusion 6.

Figure 4:
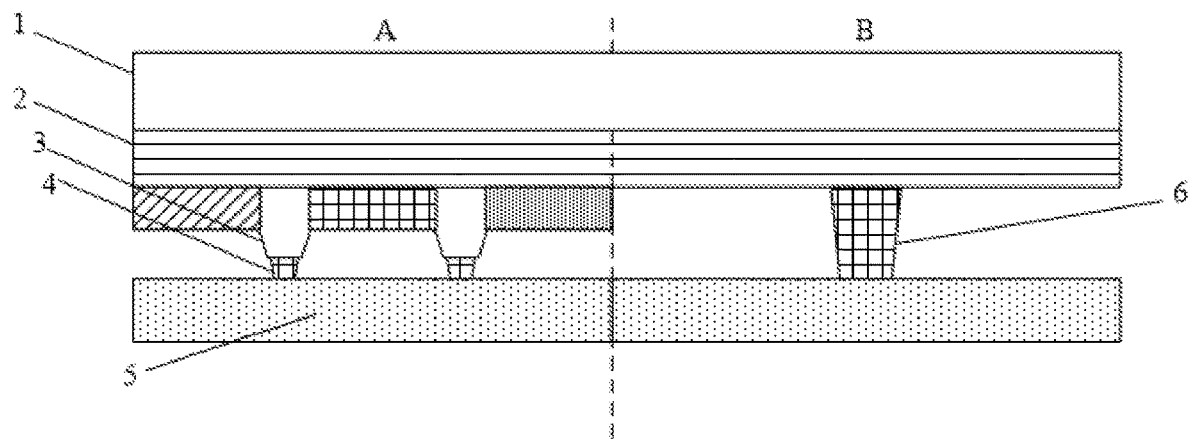
FIG. 4 is a schematic diagram illustrating the evaporation with the fine metal mask in the manufacturing process of the OLED display substrate according to an embodiment of the disclosure.

The protrusion 6 has a certain height, and an end surface of the protrusion 6 away from the base layer 1 of the OLED display substrate has a total area smaller than that of the edge area B. As shown in FIG. 4, when the evaporation is performed with the fine metal mask 5, the protrusion 6 can support the fine metal mask 5 to avoid excessive contact of the fine metal mask 5 with the edge area B.

In the present embodiment, the edge area of the OLED display substrate is provided with the protrusion to prevent the fine metal mask from coming into excessive contact with the edge area, in this way, the protrusion can support the fine metal mask when the fine metal mask is used for evaporating the OLED display substrate in the manufacturing process of the OLED display substrate, so as to avoid excessive contact of the fine metal mask with the edge area of the OLED display substrate, and avoid electrostatic discharge in the evaporation process. As a result, the yield of the OLED display substrate products is improved, the fine metal mask is free of damages and its service life is prolonged, and the production costs are reduced.

As shown in FIGS. 3 and 4, the spacer 4 is provided at the display area A of the OLED display substrate, and the spacer 4 can support the fine metal mask 5 when the fine metal mask 5 is used for evaporating the OLED display substrate, so as to avoid the contact of the fine metal mask 5 with the display area A. In the embodiment, a height difference between an end face of the spacer 4 away from the back plate and an end face of the protrusion 6 away from the back plate cannot be too large, otherwise, the flatness of the fine metal mask 5 may be affected, causing derogated evaporation effects. Therefore, the height difference between an end face of the spacer 4 away from the back plate and an end face of the protrusion 6 away from the back plate shall not be greater than a preset threshold value, for example, not greater than 3 μm.

Optionally, the back plate may be a glass substrate or a flexible back plate.

Optionally, an end face of the spacer 4 away from the back plate and an end face of the protrusion 6 away from the back plate are located on the same horizontal plane so that the flatness of the fine metal mask 5 can be maintained, and the occurrence of abnormalities in evaporation can be avoided.

Specifically, the protrusion 6 may be made of an insulating material, and optionally, the protrusion 6 may be made of the same material as some of the film layers of the OLED display substrate so that the protrusion 6 may be made by using available film-forming equipment in the related art without additionally requiring a novel one. Apparently, the protrusion 6 may also be made of a special material different from that of the film layers of the OLED display substrate.

In an embodiment, at least part of the protrusions 6 are made of the same material as the pixel-defining layer 3 of the OLED display substrate so that all or part of the protrusions 6 can be formed at the edge area B using a single patterning process while the pixel-defining layer 3 is patterned at the display area A.

In another embodiment, at least part of the protrusions 6 are made of the same material as the spacer 4 of the OLED display substrate, so that all or part of the protrusions 6 can be formed at the edge area B using a single patterning process while the spacers 4 is patterned at the display area A.

Figure 5:
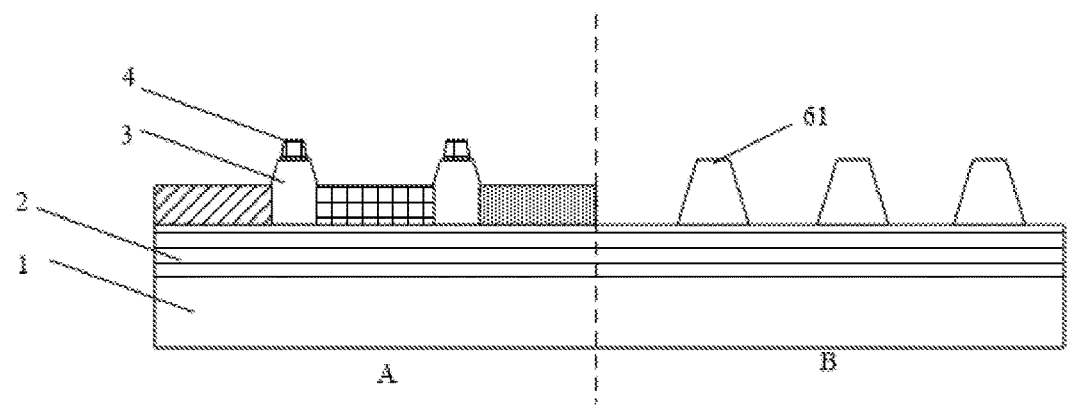
FIGS. 5 to 7 are schematic diagrams showing the structure of the OLED display substrate according to embodiments of the disclosure.

In a specific example, as shown in FIG. 5, a support 61 may be formed as the protrusion 6 by using the material of the pixel-defining layer 3, and in particular, the support 61 may be formed by altering a mask used for manufacturing the pixel-defining layer in the related art. For example, in the related art, a mask for manufacturing a pixel-defining layer includes an opaque pattern corresponding to the pixel-defining layer 3 at the display area A and a light-transmitting pattern other than the opaque pattern, with which the pixel-defining layer material of an entire layer is patterned to form the pattern of the pixel-defining layer 3 at the display area A. In the embodiment, the mask includes, in addition to the opaque pattern corresponding to the pixel-defining layer 3 at the display area A, an opaque pattern corresponding to the support 61 at the edge area B. In this way, after patterning the pixel-defining layer material of the entire layer by using the mask, not only the pattern of the pixel-defining layer 3 at the display area A, but also the support 61 at the edge area B can be formed. Here, the support 61 may have a cylindrical shape, and a longitudinal section of the support 61 may be trapezoidal or rectangular, etc. Apparently, the support 61 is not limited to a cylindrical shape, but may have other shapes, such as a hemispherical shape, etc.

Figure 6:
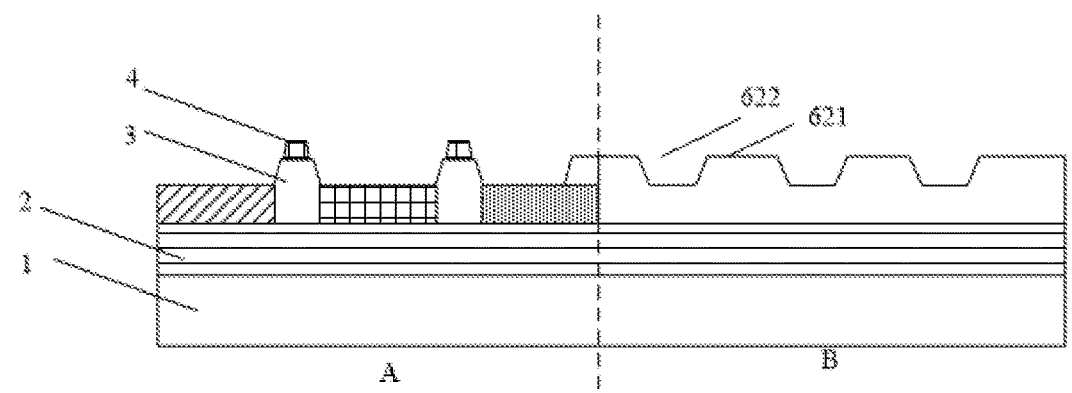

In another specific example, as shown in FIG. 6, the pixel-defining layer of the entire layer may be formed at the edge area B, and then the protrusion 6 may be formed by trenching the pixel-defining layer at the edge area B. The mask used for manufacturing the pixel-defining layer includes an opaque pattern corresponding to the pixel-defining layer 3 at the display area A and a light-transmitting pattern other than the opaque pattern, with which the pixel-defining layer material of an entire layer is patterned to form the pattern of the pixel-defining layer 3 at the display area A. In the embodiment, the mask includes, in addition to the opaque pattern corresponding to the pixel-defining layer 3 at the display area A, an opaque pattern corresponding to a projection 621 at the edge area B and a semi-transparent pattern corresponding to a groove 622 at the edge area B. In this way, after patterning the pixel-defining layer material of the entire layer by using the mask, not only the pattern of the pixel-defining layer 3 at the display area A, but also the projection 621 and the grooves 622 at the edge area B can be formed. Here, a thickness of the projection 621 is greater than that of the groove 622. Therefore, the projection 621 can be used as the protrusion 6 to support the fine metal mask 5.

Figure 7:
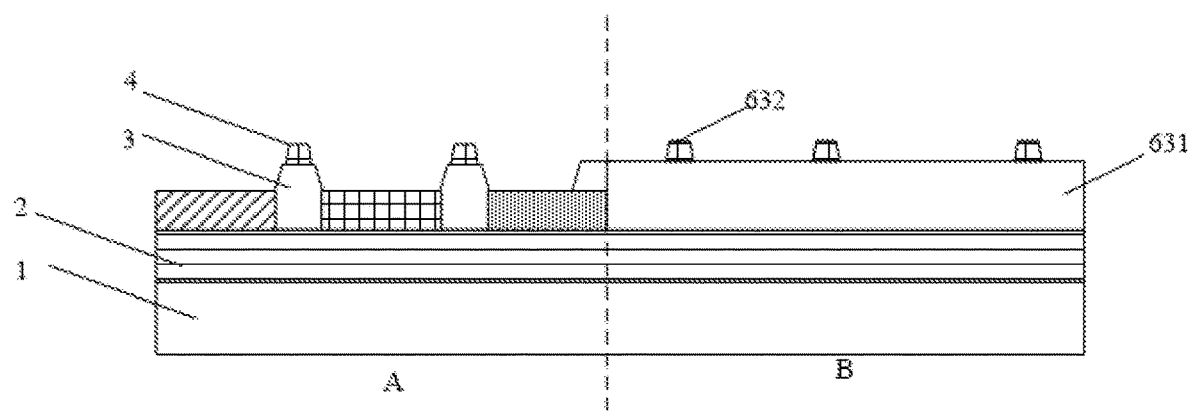

In another specific example, as shown in FIG. 7, the pixel-defining layer 631 of the entire layer may be formed at the edge area B, and then an auxiliary spacer 632 may be formed on the pixel-defining layer 631 at the edge area B to compose the protrusion 6. Here, the auxiliary spacer 632 can be made of the same material as the spacer 4, the auxiliary spacer 632 and the spacer 4 can be formed simultaneously through a single patterning process, requiring only alterations to the mask used for manufacturing the spacer 4 in the related art. The mask used for manufacturing the spacer 4 in the related art includes an opaque pattern corresponding to the spacer 4 at the display area A and a light-transmitting pattern corresponding other than the opaque pattern, with which the pixel-defining layer material of an entire layer is patterned to form the spacer 4 at the display area A. In the embodiment, the mask includes, in addition to an opaque pattern of the spacer 4 corresponding to the display area A, an opaque pattern corresponding to the auxiliary spacer 632 at the edge area B. In this way, after patterning the spacer material of the entire layer by using the mask, not only the spacer 4 at the display area A, but also the auxiliary spacer 632 located at the edge area B can be formed. The pixel-defining layer 631 and the auxiliary spacer 632 can compose the protrusion 6.

The embodiments of the disclosure further provide a display device including the OLED display substrate mentioned above. The display device may be a TV, a monitor, a digital photo frame, a mobile phone, a tablet and other products or components with display functions, wherein the display device further includes a flexible circuit board, a printed circuit board, and a back plate.

The embodiment of the disclosure further provides a manufacturing method of the OLED display substrate, the OLED display substrate including the display area and the edge area surrounding the display area, the manufacturing method including the steps of:

forming a planarization layer on the back plate; and forming the protrusion at the edge area.

In the embodiment, the edge area of the OLED display substrate is provided with the protrusions to prevent the fine metal mask from coming into excessive contact with the edge area, in this way, these protrusions can support the fine metal mask when the fine metal mask is used for evaporating the OLED display substrate in the manufacturing process of the OLED display substrate to avoid excessive contact of the fine metal mask with the edge area of the OLED display substrate, and avoid electrostatic discharge in the evaporation process, as a result, the yield of the OLED display substrate products is improved, the fine metal mask is free of damages and its service life is prolonged, and the production costs are reduced.

As shown in FIGS. 3 and 4, the spacer 4 is provided at the display area A of the OLED display substrate, and the spacer 4 can support the fine metal mask 5 when the fine metal mask 5 is used for evaporating the OLED display substrate to avoid the contact of the fine metal mask 5 with the display area A. In the embodiment, a height difference between an end face of the spacer 4 away from the back plate and an end face of the protrusion 6 away from the back plate cannot be too large, otherwise, the flatness of the fine metal mask 5 may be affected, causing derogated evaporation effects. Therefore, the height difference between an end face of the spacer 4 away from the back plate and an end face of the protrusion 6 away from the back plate shall not be greater than a preset threshold value, for example, not greater than 3 μm.

Optionally, an end face of the spacer 4 away from the back plate and an end face of the protrusion 6 away from the back plate are located on the same horizontal plane so that the flatness of the fine metal mask 5 can be maintained, and the occurrence of abnormalities in evaporation can be avoided.

Specifically, the protrusion 6 may be made of an insulating material, and optionally, the protrusion 6 may be made of the same material as some of the film layers of the OLED display substrate so that the protrusion 6 may be made by using available film-forming equipment in the related art without additionally requiring a novel one. Apparently, the protrusion 6 may also be made of a special material different from that of the film layers of the OLED display substrate.

In an embodiment, at least part of the protrusions 6 are made of the same material as the pixel-defining layer 3 of the OLED display substrate so that all or part of the protrusions 6 can be formed at the edge area B using a single patterning process while the pixel-defining layer 3 is patterned at the display area A.

Now that all the protrusions 6 are made of the same material as the pixel-defining layer 3 of the OLED display substrate, forming the protrusion includes:

forming the pixel-defining layer of the OLED display substrate and the protrusion on the planarization layer through a single patterning process, wherein the pixel-defining layer and the protrusion are made of the same material.

In a specific example, as shown in FIG. 5, a protrusion 61 may be formed by using the material of the pixel-defining layer 3, and in particular, the support 61 may be formed by altering a mask used for manufacturing the pixel-defining layer in the related art. For example, in the related art, a mask for manufacturing a pixel-defining layer includes an opaque pattern corresponding to the pixel-defining layer 3 at the display area A and a light-transmitting pattern other than the opaque pattern, with which the pixel-defining layer material of an entire layer is patterned to form the pattern of the pixel-defining layer 3 at the display area A. In the embodiment, the mask includes, in addition to the opaque pattern corresponding to the pixel-defining layer 3 at the display area A, an opaque pattern corresponding to the support 61 at the edge area B. In this way, after patterning the pixel-defining layer material of the entire layer by using the mask, not only the pattern of the pixel-defining layer 3 at the display area A, but also the support 61 at the edge area B can be formed. Here, the support 61 may have a cylindrical shape, and a longitudinal section of the support 61 may be trapezoidal or rectangular, etc. Apparently, the support 61 is not limited to a cylindrical shape, but may have other shapes, such as a hemispherical shape, etc.

In another specific example, as shown in FIG. 6, the pixel-defining layer of the entire layer may be formed at the edge area B, and then the protrusion 6 may be formed by trenching the pixel-defining layer at the edge area B. The mask used for manufacturing the pixel-defining layer in the related art includes an opaque pattern corresponding to the pixel-defining layer 3 at the display area A and a light-transmitting pattern other than the opaque pattern, with which the pixel-defining layer material of an entire layer is patterned to form the pattern of the pixel-defining layer 3 at the display area A. In the embodiment, the mask includes, in addition to the opaque pattern corresponding to the pixel-defining layer 3 at the display area A, an opaque pattern corresponding to a projection 621 at the edge area B and a semi-transparent pattern corresponding to a groove 622 at the edge area B. In this way, after patterning the pixel-defining layer material of the entire layer by using the mask, not only the pattern of the pixel-defining layer 3 at the display area A, but also the projection 621 and the grooves 622 at the edge area B can be formed. Here, a thickness of the projection 621 is greater than that of the groove 622. Therefore, the projection 621 can be used as the protrusion 6 to support the fine metal mask 5.

In another embodiment, at least part of the protrusions 6 are made of the same material as the spacer 4 of the OLED display substrate so that all or part of the protrusions 6 can be formed at the edge area B using a single patterning process while the spacers 4 is patterned at the display area A.

Now that all the protrusions 6 and the spacer 4 of the OLED display substrate are made of the same material, the manufacturing method includes the steps of:

forming the pixel-defining layer on the planarization layer; and forming the spacer 4 at the display area of the OLED display substrate and the protrusion 6 at the edge area through a single patterning process, wherein the spacer 4 and the protrusion 6 are made of the same material.

In another embodiment, part of the protrusions 6 are made of the same material as the spacers 4 of the OLED display substrate, and other protrusions 6 are made of the same material as the pixel-defining layer 3 of the OLED display substrate. In this way, some of the protrusions 6 can be formed at the edge area B through a single patterning process while the spacer 4 is patterned at the display area A, and the other protrusions 6 can be formed at the edge area B through a single patterning process while the pixel-defining layer 3 is patterned at the display area A.

Forming the protrusion includes:

forming the pixel-defining layer at the display area and a first part of the protrusions at the edge area through a single patterning process; and forming the spacer at the display area and a second part of the protrusions at the edge area through a single patterning process, and the first part and the second part composing the protrusions.

In a specific example, as shown in FIG. 7, the pixel-defining layer 631 of the entire layer may be formed at the edge area B, and then an auxiliary spacer 632 may be formed on the pixel-defining layer 631 at the edge area B to compose the protrusion 6. Here, the auxiliary spacer 632 can be made of the same material as the spacer 4, the auxiliary spacer 632 and the spacer 4 can be formed simultaneously through a single patterning process, requiring only alterations to the mask used for manufacturing the spacer 4 in the related art. The mask used for manufacturing the spacer 4 in the related art includes an opaque pattern corresponding to the spacer 4 at the display area A and a light-transmitting pattern corresponding other than the opaque pattern, with which the pixel-defining layer material of an entire layer is patterned to form the spacer 4 at the display area A. In the embodiment, the mask includes, in addition to an opaque pattern of the spacer 4 corresponding to the display area A, an opaque pattern corresponding to the auxiliary spacer 632 at the edge area B. In this way, after patterning the spacer material of the entire layer by using the mask, not only the spacer 4 at the display area A, but also the auxiliary spacer 632 located at the edge area B can be formed. The pixel-defining layer 631 and the auxiliary spacer 632 can compose the protrusion 6.

Unless defined otherwise, technical or scientific terms used in this disclosure should be construed as having the ordinary meaning understood by those of ordinary skill in the art to which this disclosure pertains. The "first", "second", and similar terms used in this disclosure do not denote any order, quantity, or priority, but rather are used solely to distinguish one component from another. The terms "comprise", "include", and the like, means that an element or article that precedes the word is inclusive of the elements or articles listed after the word and equivalents thereof, but does not exclude other elements or articles. The terms "connected", "coupled", and the like, are not limited to physical or mechanical connections, but may include electrical connections, either direct or indirect. The terms "upper", "lower", "left", "right", and the like, are used merely to indicate a relative positional relationship that may change accordingly when the absolute position of the described object changes.

It will be understood that when an element such as a layer, film, area, or substrate is referred to as being "above" or "under" another element, the element may be "directly" "above" or "under" the other element, or through intermediate elements.

While the foregoing is illustrative of optional embodiments of the disclosure, it will be appreciated by those of ordinary skill in the art that various modifications and adaptations may be made without departing from the principles of the disclosure, and such modifications and adaptations are to be considered within the scope of the disclosure.

What is claimed is:

1. An OLED display substrate having a display area and an edge area surrounding the display area, the OLED display substrate comprising a back plate and a pixel-defining layer on the back plate, wherein the OLED display substrate comprises a transistor array layer, and the transistor array layer extends to the edge area;

at the edge area of the OLED display substrate, an auxiliary spacer is provided on the pixel-defining layer, and the pixel-defining layer covers the transistor array layer at the edge area;

at the display area of the OLED display substrate, a spacer is further provided on the pixel-defining layer, and the auxiliary spacer at the edge area is made of the same material as the spacer and is fabricated through a single patterning process with the spacer; and the height difference between an end face of the spacer away from the back plate and an end face of the auxiliary spacer away from the back plate is not greater than 3 μm.

2. The OLED display substrate according to claim 1, wherein a planarization layer is provided between the back plate and the pixel-defining layer.

3. A display device, wherein the display device comprises an OLED display substrate, the OLED display substrate having a display area and an edge area surrounding the display area, the OLED display substrate comprising a back plate and a pixel-defining layer on the back plate, wherein the OLED display substrate comprises a transistor array layer, and the transistor array layer extends to the edge area;

at the edge area of the OLED display substrate, an auxiliary spacer is provided on the pixel-defining layer, and the pixel-defining layer covers the transistor array layer at the edge area;

at the display area of the OLED display substrate, a spacer is further provided on the pixel-defining layer, and the auxiliary spacer at the edge area is made of the same material as the spacer and is fabricated through a single patterning process with the spacer; and the height difference between an end face of the spacer away from the back plate and an end face of the auxiliary spacer away from the back plate is not greater than 3 μm.

4. The display device according to claim 3, wherein a planarization layer is provided between the back plate and the pixel-defining layer.

* * * * *